United States Patent [19]

Frederiksen et al.

[11] 3,872,323

[45] Mar. 18, 1975

[54] DIFFERENTIAL TO SINGLE ENDED CONVERTER CIRCUIT

[75] Inventors: Thomas M. Frederiksen, San Jose; Don William Zobel, Santa Clara, both of Calif.

[73] Assignee: Motorola, Inc., Franklin Park, Ill.

[22] Filed: Jan. 20, 1972

[21] Appl. No.: 219,462

[52] U.S. Cl. .......... 307/235 R, 307/299 B, 307/313, 330/30 D, 330/38 M

[51] Int. Cl. ....... H03k 5/153, H03f 3/14, H03f 3/18

[58] Field of Search ........... 307/235, 213, 218, 215, 307/299, 303, 313; 330/30 D, 69, 38 M; 317/235 Z

[56] References Cited

UNITED STATES PATENTS

| | | | |
|---|---|---|---|
| 3,487,323 | 12/1969 | Schaefer | 307/299 X |
| 3,541,350 | 11/1970 | Luetze | 307/299 X |
| 3,610,955 | 10/1971 | Blaser et al. | 328/146 X |
| 3,626,313 | 12/1971 | Zuk | 307/303 X |
| 3,633,052 | 1/1972 | Hanna | 307/299 |
| 3,648,154 | 3/1972 | Frederiksen | 323/22 T |
| 3,649,846 | 3/1972 | Frederiksen | 330/30 D X |
| 3,673,508 | 6/1972 | Callahan | 330/30 D |
| 3,683,270 | 8/1972 | Mattis | 323/22 T X |
| 3,688,220 | 8/1972 | Gay | 307/255 X |
| 3,700,921 | 10/1972 | Gay | 307/235 R |

OTHER PUBLICATIONS

Hunter, Handbook of Semiconductor Electronics, pps. 10-11 to 10-14, 11-73 to 11-75, 17-46 & 17-47; McGraw-Hill Co. 1970.

*Primary Examiner*—Michael J. Lynch
*Assistant Examiner*—L. N. Anagnos
*Attorney, Agent, or Firm*—Mueller, Aichele & Ptak

[57] ABSTRACT

Circuit for coupling to first and second current paths in which differentially related currents flow for providing a single output current which represents the differentially related currents. The converter circuit is particularly adapted for use in integrated circuits and utilizes a single multiple collector transistor with interconnections of the electrodes and connections thereof to the current paths. One of the collector electrodes of the transistor is connected to the base electrode and the junction thereof is connected in one current path to control the conductivity of the multiple collector transistor. The second collector electrode is connected in the second current path, with the collector electrodes being of equivalent configurations so that the same current flows through each. The output current is derived from the circuit connected to the second collector electrode and is a measure of the differential currents, and has a direction which indicates the path in which the differential current flows.

8 Claims, 3 Drawing Figures

PRIOR ART

DIFFERENTIAL TO SINGLE ENDED CONVERTER CIRCUIT

BACKGROUND OF THE INVENTION

This application relates generally to a differential to single ended converter circuit and more particularly to such a circuit using a multi-collector transistor. This circuit is useful in a comparison amplifier such as that disclosed in U.S. Pat. No. 3,649,846, issued Mar. 14, 1972, to Thomas M. Frederiksen.

It is common practice in circuits constructed in integrated circuit form for many applications to use differential comparison circuits or amplifiers. For example, many control circuits provide a control operation in response to a voltage which varies about a given level. A voltage of the given level can be used as the reference voltage for the differential amplifier, and the control voltage can be applied to the second input. The output of the differential amplifier can be taken from either one of the differentially coupled transistors. However, in order to obtain a larger and more useful output, a differential to single ended converter can be used which produces an output of one polarity when one of the differential transistors conducts and an output of the opposite polarity when the other transistor conducts. This provides a two-to-one increase with respect to the output taken from one branch of the differential circuit as referred to above. The aforementioned Frederiksen application describes a differential comparator amplifier circuit with a differential to single ended converter circuit coupled thereto. This circuit requires the use of a transistor and a separate diode, and when constructed on an integrated circuit chip this requires spaces for two semiconductor devices.

SUMMARY OF THE INVENTION

It is an object of the present invention to provide a simple and effective differential to single ended converter circuit.

Another object of the invention is to provide a differential to single ended converter circuit which requires a single semiconductor device.

A further object of the invention is to provide a differential to single ended converter circuit which is adapted for use on a semiconductor chip and which requires a minimum of space on the chip.

In accordance with this invention, a differential to single ended converter circuit is provided which may be used with a differential stage, such as a differential amplifier having a pair of transistors with emitters coupled together and with collectors coupled in separate circuit paths or branches. A current supply provides current to the two paths, and the base of the transistor in one path is connected to a reference potential, and the base of the transistor in the other path is connected to the input potential. The circuit of the invention includes a single converter transistor having first and second collector electrodes and single base and emitter electrodes. One collector electrode is connected to the base electrode and this junction is connected in one path of the differential circuit. The other collector is connected in the other path of the differential circuit, with the emitter of the converter transistor being common to both branches. An output terminal connected to the second path provides current in accordance with the differentially related currents flowing in the two branches. If current flows through the transistor in the first path, this will cause current flow through the second collector which provides output current flowing in one direction. In the event that the transistor in the first path is nonconducting, the converter transistor will be cut off, and there will be no current through the second collector thereof. However, the second path of the differential circuit will supply current to the output terminal which flows in the opposite direction.

DETAILED DESCRIPTION

Figure 1:
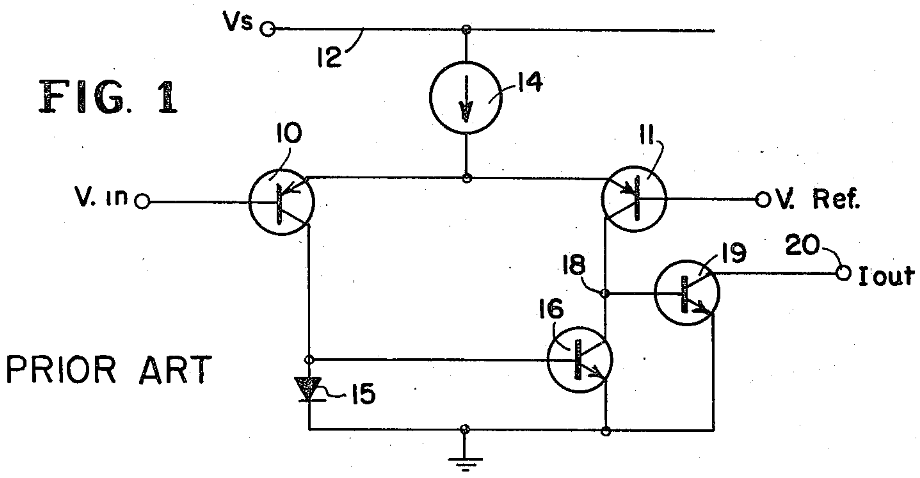
FIG. 1 PRIOR ART
FIG. 1 illustrates a prior art circuit.

In FIG. 1 there is shown a circuit as described in U.S. Pat. No. 3,649,846, referred to above. This circuit is suitable for use as a differential amplifier or comparison circuit, with PNP transistors 10 and 11 forming the two sides of the differential circuit. Current is supplied from voltage supply 12 through current source 14 to the emitter electrodes of the transistors 10 and 11, which are connected together. The input voltage is applied to the base of transistor 10, and a reference voltage is applied to the base of transistor 11. Connected between the collector of transistor 10 and the ground side of the voltage supply is a diode 15. Connected between the collector electrode of transistor 11 and ground is the collector-emitter path of NPN transistor 16. The base of transistor 16 is connected to the junction between diode 15 and the collector of transistor 10. Diode 15 and transistor 16 are constructed so that when current flows through diode 15, transistor 16 will be biased to conduct the same amount of current through its collector to emitter path. Connected between the collector electrodes of transistors 11 and 16 is an output terminal 18 of the first stage. This may be coupled to the base of NPN transistor 19 to control current at output terminal 20.

Considering now the operation of the circuit shown in FIG. 1, when the input voltage is less than the reference voltage so that transistor 10 conducts, the collector current of transistor 10 will flow through diode 15 and produce a voltage thereacross which is applied between the base and emitter of transistor 16. This will cause transistor 16 to conduct, and the same current will flow through the collector emitter path of transistor 16 as through diode 15. Inasmuch as transistor 11 is not conducting when transistor 10 fully conducts, due to the differential action, transistor 16 will saturate and keep transistor 19 off, providing the output state which will not accept current at terminal 20. When the input voltage at transistor 10 is more than the reference voltage applied to the base of transistor 11, transistor 11 will fully conduct and transistor 10 will not conduct. When transistor 10 is not conducting there will be no current flow through diode 15, and no voltage developed thereacross to render transistor 16 conducting. Accordingly, transistor 16 will be cut off. The current through transistor 11 will then flow into the base of transistor 19, rendering this transistor conducting. The current at terminal 18 has reversed, and the output state is reached wherein output terminal 20 will accept current.

Figure 2:
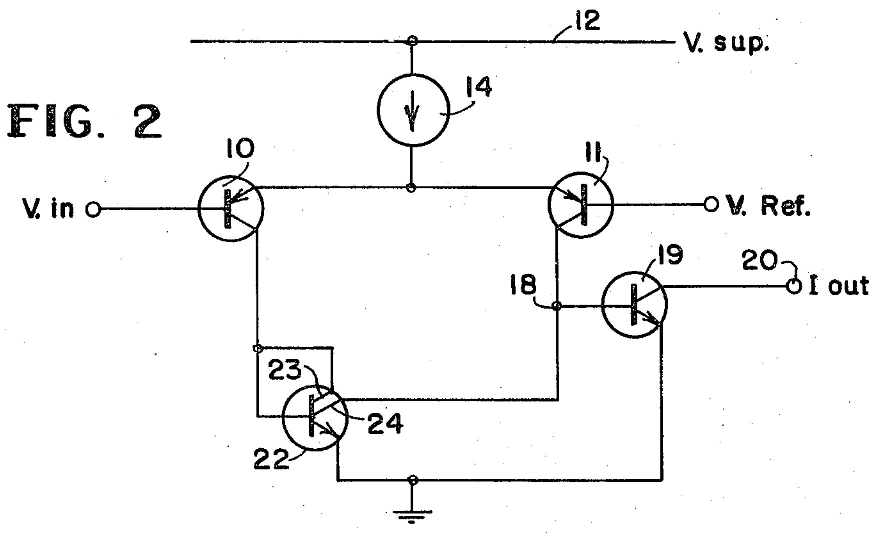
FIGS. 2 and 3 illustrate circuits in accordance with the invention.

In FIG. 2 the differential circuit including transistors 10 and 11 is the same as in FIG. 1, except a single NPN transistor 22 having two collector electrodes 23 and 24 is substituted for the diode 15 and the transistor 16. The collector 23 of transistor 22 is connected to the base of transistor 22, and the common junction is connected to the collector of transistor 10. The collector 24 of transistor 22 is connected to the collector of transistor 11. The collectors 23 and 24 will be of equal size, or of a construction so that the same current flows through both transistors.

When the differential circuit of FIG. 2 is unbalanced so that all of the current flows through transistor 10 and there is no current through transistor 11, current will flow from the collector of transistor 10 through the collector 23 to emitter path of transistor 22. This causes transistor 22 to conduct, and the same current could flow through the collector 24 to emitter path of transistor 22. Since transistor 11 is not conducting, this current is not available, and transistor 19 is held off. When the circuit of FIG. 2 is unbalanced so that transistor 11 fully conducts and transistor 10 is cut off, there will be no current flow through the collector 23 of transistor 22 and transistor 22 will not conduct. In such case, no current flows through the collector 24 of transistor 22. Accordingly, the current flowing in the collector of transistor 11 will all flow into the base of transistor 19, turning this transistor on. The current at terminal 18 therefore reverses, depending upon which of the transistors 10 and 11 of the differential circuit is conducting, and controls the current through the output terminal 20.

The circuit including transistors 10 and 11, which form the differential circuit, and transistor 22 can be constructed as an integrated circuit on a semiconductor chip. Components which form the current source 14, and the output transistor 19 can also be provided on this chip. Techniques are available for constructing the NPN transistor 22 on the same chip with the PNP transistors 10 and 11. The multiple collector transistor 22 requires only a small amount of additional space on the chip over that required by a single collector transistor, and takes much less space than the diode 15 and transistor 16 in the circuit of FIG. 1, when constructed in the known way. A standard multiple emitter transistor can be used in some applications with the collector and emitter electrodes interchanged.

Figure 3:
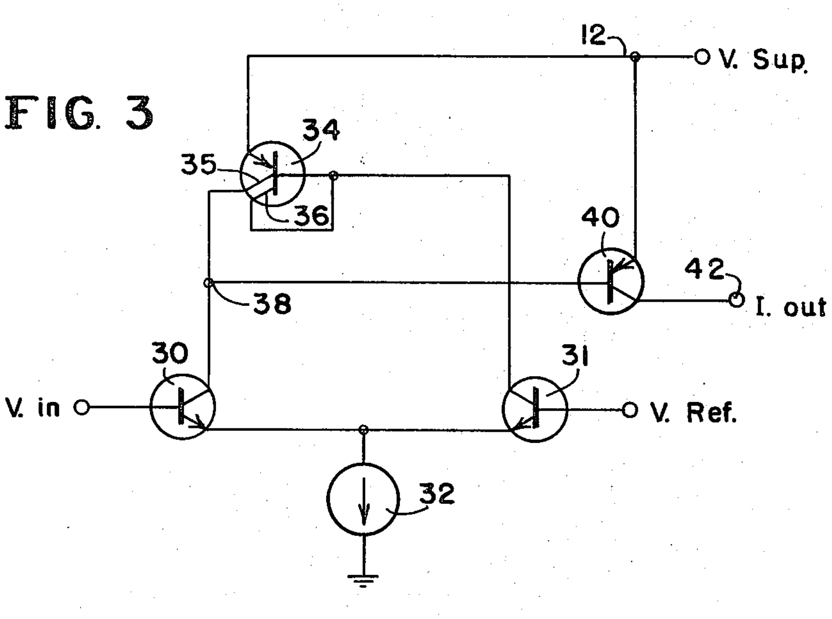

In FIG. 3, there is shown a circuit similar to the circuit of FIG. 2, except that transistors of opposite polarities are used, and the connections to the power supply are changed as required. In this circuit the differential amplifier is formed by NPN transistors 30 and 31 having their emitters connected together and through current source 32 to ground. An input signal is applied to the base of transistor 30, and a reference potential is applied to the base of transistor 31. The supply potential is applied from supply line 12 to the collectors of transistors 30 and 31 through the differential to single ended converter formed by transistor 34. This is a double collector PNP transistor including collectors 35 and 36, which may be constructed to provide the same current flow. The emitter of transistor 34 is connected to the supply line 12, and collector 35 thereof is connected to the collector of transistor 30. The collector 36 of the transistor 34 is connected to the base thereof, and to the collector of transistor 31.

In the event that the differential amplifier is unbalanced so that transistor 31 is fully conducting, the collector current thereof flows through the collector 36 of transistor 34, causing transistor 34 to conduct. The same collector current will then flow through collector 35 of transistor 34. Because of the differential action of transistors 30 and 31, transistor 30 is nonconducting, and the current through collector 35 of transistor 34 flows through terminal 38 to the base of transistor 40, which keeps transistor 40 off. In the event that the input voltage applied to the base of transistor 30 is at a level so that transistor 30 fully conducts and transistor 31 is cut off, there will then be no current through collector 36 of transistor 34 and transistor 34 will be cut off. Accordingly, no current will flow through collector 35 of transistor 34. The collector current of transistor 30 will then be drawn from the base of transistor 40. The available current through terminal 38 therefore reverses.

The PNP transistor 34 can be constructed on an integrated circuit chip with the NPN transistors 30 and 31. The current source 32 and output transistor 40 may also be provided on the same chip. The multiple collector transistor 34 does not require a significantly greater amount of space than a single collector PNP transistor.

The differential to single ended converter circuit which has been described has been found to be highly advantageous for use in integrated circuits which utilize differential circuits. The space required on the IC chip is significantly reduced and the required number of interconnections is also reduced.

We claim:

1. A differential to single ended converter circuit for coupling to first and second signal current paths in which differentially related signal currents flow, and providing output signal current therefrom, including in combination semiconductor means including a single base electrode, a single emitter electrode, and first and second collector electrodes, said semiconductor means forming a single multi-collector transistor, first circuit means connecting said first collector electrode to said base electrode at a junction, second circuit means connecting said junction and said emitter electrode in the first signal current path, third circuit means connecting said second collector electrode and said emitter electrode in the second signal current path, and output circuit means connected to said third circuit means for providing output signal current related to the signal currents in the first and second current paths.

2. The circuit of claim 1 wherein said semiconductor means and said first circuit means are provided as a unitary structure with a first terminal connected to said junction, a second terminal connected to said emitter electrode, and a third terminal connected to said second collector electrode.

3. The circuit of claim 2 wherein said semiconductor means includes a transistor of the PNP type which is constructed on a semiconductor chip with other components.

4. The circuit of claim 2 wherein said semiconductor means includes a transistor of the NPN type which is constructed on a semiconductor chip with other components.

5. A differential comparator circuit including in combination;

first and second transistors each having a base electrode, an emitter electrode and a collector electrode, with said emitter electrodes of said first and second transistors being connected together, an input terminal connected to said base electrode of one of said first and second transistors for applying input signals thereto and a reference terminal connected to said base electrode of the other of said first and second transistors, a third transistor including a single base electrode a single emitter electrode and first and second collector electrodes;

first circuit means connecting said first collector electrode of said third transistor to said base electrode thereof and to said collector electrode of said first transistor, second circuit means connecting said second collector electrode of said third transistor to said collector electrode of said second transistor, current source means connected between said emitter electrodes of said first and second transistors and said emitter electrode of said third transistor, and output current means connected to said second circuit means.

6. The circuit of claim 5 wherein said first and second transistors are of the same conductivity type, and said third transistor is of opposite conductivity type to that of said first and second transistors.

7. The circuit of claim 6 wherein said first second and third transistors, and said circuit means are constructed as a single integrated circuit chip.

8. The circuit of claim 6 wherein said first and second transistors are of the NPN type and said third transistor is of the PNP type.

* * * * *